United States Patent
Farrar et al.

(10) Patent No.: US 6,747,347 B2
(45) Date of Patent: Jun. 8, 2004

(54) MULTI-CHIP ELECTRONIC PACKAGE AND COOLING SYSTEM

(75) Inventors: Paul A. Farrar, South Burlington, VT (US); Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 09/945,024

(22) Filed: Aug. 30, 2001

(65) Prior Publication Data

US 2003/0043543 A1 Mar. 6, 2003

(51) Int. Cl.⁷ .......................... H01L 23/02; H01L 23/34
(52) U.S. Cl. ....................... 257/686; 257/685; 257/723; 257/712; 257/717
(58) Field of Search ................................. 257/686, 685, 257/723, 712, 713, 714, 715, 716, 717, 721; 361/735, 696, 697, 698, 699, 687, 688, 689, 690

(56) References Cited

U.S. PATENT DOCUMENTS

| | | |
|---|---|---|
| 3,548,915 A | 12/1970 | Reading et al. |
| 3,548,948 A | 12/1970 | Reading et al. |
| 3,687,737 A | 8/1972 | Krock et al. |
| 4,389,429 A | 6/1983 | Soclof |
| 4,525,921 A | 7/1985 | Carson et al. |
| 4,561,173 A | 12/1985 | Te Velde |
| 4,617,160 A | 10/1986 | Belanger et al. |
| 4,706,166 A | 11/1987 | Go |
| 4,962,058 A | 10/1990 | Cronin et al. |
| 4,963,976 A * | 10/1990 | Fluegel et al. ............... 257/685 |
| 5,202,754 A | 4/1993 | Bertin et al. |
| 5,270,261 A | 12/1993 | Bertin et al. |
| 5,270,572 A * | 12/1993 | Nakajima et al. ............ 257/714 |
| 5,324,683 A | 6/1994 | Fitch et al. |
| 5,324,684 A | 6/1994 | Kermani et al. |
| 5,336,914 A | 8/1994 | Andoh |
| 5,408,742 A | 4/1995 | Zaidel et al. |
| 5,444,105 A | 8/1995 | Ornstein |
| 5,457,334 A | 10/1995 | Nishimoto |
| 5,478,781 A | 12/1995 | Bertin et al. |
| 5,506,753 A | 4/1996 | Bertin et al. |
| 5,509,468 A * | 4/1996 | Lopez .......................... 257/721 |
| 5,510,645 A | 4/1996 | Fitch et al. |
| 5,578,146 A | 11/1996 | Grant et al. |
| 5,581,498 A | 12/1996 | Ludwig et al. |
| 5,593,926 A | 1/1997 | Fujihira |
| 5,891,797 A | 4/1999 | Farrar |
| 5,994,777 A | 11/1999 | Farrar |
| 6,008,530 A * | 12/1999 | Kano .......................... 257/666 |
| 6,014,313 A * | 1/2000 | Hesselbom .................. 361/704 |
| 6,115,242 A * | 9/2000 | Lambrecht .................. 361/684 |
| 2003/0015781 A1 * | 1/2003 | Frrar ........................... 257/777 |

OTHER PUBLICATIONS

"The New Low–k Candidate: It's A Gas"; Semiconductor International; Mar. 1999, p. 38.

E. Jan Vardaman; "Future Packaging Trends: CSP vs. Flip Chip"; Proceedings of the 11th European Microlectronics Conference; 1997; p. 295–99

A.J. Blodgett and D.R. Barbour; "Thermal Conduction Module: A High–Performance MULTILAYER Ceramic Package"; IBM Journal of Research and Development, vol. 26 No. 1; Jan. 1982; p. 30–36.

* cited by examiner

Primary Examiner—Jasmine Clark
(74) Attorney, Agent, or Firm—Knobbe Martens Olson & Bear LLP

(57) ABSTRACT

A multi-chip electronic package comprised of a plurality of integrated circuit chips secured together in a stack formation. The chip stack is hermetically sealed in an enclosure. The enclosure comprises a pressurized, thermally conductive fluid, which is utilized for cooling the enclosed chip stack. A process and structure is proposed that allows for densely-packed, multi-chip electronic packages to be manufactured with improved heat dissipation efficiency, thus improving the performance and reliability of the multi-chip electronic package.

62 Claims, 4 Drawing Sheets

MULTI-CHIP ELECTRONIC PACKAGE AND COOLING SYSTEM

RELATED APPLICATIONS

This application is related to co-pending U.S. patent application No. 09/945,042 filed Aug. 31, 2001 entitled "MULTIPLE CHIP STACK STRUCTURE AND COOLING SYSTEM"

BACKGROUND OF THE INVENTION

1. Field of the Invention

The present invention relates to semiconductor processing technology and, in particular, concerns an electronic module comprised of a multi-chip electronic package having improved heat dissipation.

2. Description of the Related Art

Semiconductor manufacturers continually strive to increase the packaging density of integrated circuit chips, which has led to the development of high-density electronic packaging modules such as three-dimensional multi-chip structures. Multi-chip structures typically comprise a plurality of integrated circuit chips that are adhered together in a stack so as to reduce the amount of space that the chips occupy inside a system. Typically, each chip in the stack has a plurality of conductive input/output contacts that are exposed on at least one lateral surface of the chip. The exposed contacts provide conductive interconnection between the chips in the stack and external circuitry.

As a result of the increased device density of VLSI (Very-Large-Scale Integration) and ULSI (Ultra-Large-Scale Integration) integrated circuitry, wiring interconnective metallurgy between input/output terminals of stacked integrated circuit chips has become increasingly more complex. A higher packaging density likely requires an increase in the number of conductors, which likely reduces the space between adjacent conductors. Unfortunately, such dimensional reductions tend to increase the capacitance between adjacent conductors, thereby possibly increasing signal propagation delays and signal cross-talk. The limitations brought about by capacitive coupling between adjacent conductors has become a significant impediment to achieving higher wiring density.

The capacitive coupling effect is particularly apparent in high-density electronic packaging modules, such as three-dimensional multi-chip structures. In some multi-chip structures, the conductive leads on the integrated circuit chips are closely spaced, and adjacent leads may sometimes be separated by less than 1 micron. Consequently, reducing the distance between adjacent leads may adversely impact the functionality of the multi-chip structure due to an increase in the capacitive load between adjacent conductors. In addition, stacking the chips in close proximity to one another as required in multi-chip structures may also increase the capacitive coupling effect between conductors of adjacent chips.

Many integrated circuit chip designers have tried to address the problem of increased capacitive coupling between adjacent conductors by utilizing insulative materials that have lower dielectric constants than conventional dielectrics such as silicon-dioxide ($SiO_2$), which has a dielectric constant of about 4.5. In some cases, polymers, such as polyimides, which have a dielectric constant of about 2.8–3.5, have been used in place of $SiO_2$. However, the polyimides provide limited improvement for the capacitive coupling problem and, therefore, do not provide a significant advantage in use.

Alternatively, interconnects incorporating an air bridge structure have also been developed and are described in prior art references such as U.S. Pat. No. 5,891,797 to Farrar. Air bridge structures generally comprise suspended conductors that are surrounded by an air gap instead of the more conventional insulators. For example, U.S. Pat. No. 5,324,683 to Fitch et al. describes the formation of an air bridge structure in an integrated circuit by removing all or a portion of the dielectric layer between conductors so that the conductors are surrounded and insulated by an air gap. Air has a dielectric constant of approximately 1.0, which is substantially less than the dielectric constants of conventionally used insulators such as $SiO_2$ or various polymides. As such, the air-gap insulator provides some improvement for the capacitive coupling effect associated with the increased wiring density of integrated circuit chips.

Although air bridge structures permit an increase in the integrated circuit wiring density, the use of air bridges introduces some new problems such as the effective removal of heat from the air bridge structures. Generally, increasing the integrated circuit wiring density leads to a decrease in the cross-sectional area of the conductors. As the cross-sectional area of an air bridge conductor decreases, the electrical resistance of the conductor increases, which results in an increase of the operating temperature of the conductors.

Excessive heat generation is particularly apparent in high-density multi-chip electronic packages, such as multi-chip modules or three-dimensional multi-chip structures. As the number of components in a multi-chip electronic package increases and the packaging density becomes more compact, the ability of heat to dissipate efficiently diminishes, which increases the risk of self-overheating and may reduce the reliable life of the semiconductor device. Moreover, integrated circuit and device functional characteristics may also depend on ambient temperature within the multi-chip electronic package. Therefore, as the ambient temperature of the package increases due to excessive heat generated by the conductors, hot spots within the multi-chip electronic package may form and adversely affect the performance of the integrated circuit.

Hence, from the foregoing, it will be appreciated that there is a need for an electronic module having higher wiring density combined with an efficient cooling system that effectively removes heat from the module. What is proposed herein is a densely packed electronic module having improved heat dissipation efficiency and a process of manufacturing the same.

SUMMARY OF THE INVENTION

In one aspect, the preferred embodiments of the present invention provide an electronic packaging module comprising a plurality of integrated circuit chips stacked and secured together to form a chip stack wherein the chip stack has a first lateral face that is comprised of a first portion of each chip. The module further comprises an enclosure enclosing the chip stack. Preferably, the enclosure is configured to receive and enclose a thermally conductive fluid having a thermal conductivity greater than that of air at one atmosphere, wherein said thermally conductive fluid contacts the chip stack and transfers heat away from the chips. In one embodiment, the thermally conductive fluid comprises a hydrogen and helium gas mixture. In another embodiment, the gas mixture is pressurized within the enclosure.

In another embodiment, at least one chip in the stack has a support frame that extends from an upper surface of the chip substrate and along an outer perimeter of the substrate so as to define a spatial region containing interconnection wiring, including air bridge conductors. The support frame further comprises a plurality of openings that are configured to permit the thermally conductive fluid to flow therethrough and contact the interconnection wiring in the spatial region even though the chip is sandwiched in a stack. Furthermore, in yet another embodiment, the support frame further comprises an upper portion that serves as a spacer separating the chip from adjacent chips. Advantageously, the thickness of the upper portion can be adjusted in accordance with the desired distance between adjacent chips and/or between rows of conductive contacts on adjacent chips.

In another aspect, the preferred embodiments provide an electronic packaging module comprising a plurality of integrated circuit chips stacked and secured together to form a chip stack that has four lateral faces with each lateral face comprising a portion of each chip. Furthermore, three exterior chips are mounted respectively to three of the lateral faces of the chip stack in a manner such that a surface of each exterior chip extends across at least a portion of each respective lateral face. The module also comprises a bonding substrate that is electrically connected, preferably via C4 connection, to conductive contacts formed on the fourth lateral face of the chip stack. Preferably, the conductive contacts are aligned to bond with the C4 structures on the substrate by precisely controlling the thickness of the spacer separating adjacent chips. Furthermore, the module comprises an enclosure that encloses the chip stack, the exterior chips, and at least a portion of the bonding substrate. The enclosure also contains a thermally conductive fluid having a thermal conductivity greater than that of air and the fluid makes contact with at least some of the chips and transfers heat away from said chips.

In yet another aspect, the preferred embodiments of the present invention provide an electronic packaging module that is comprised of a plurality of semiconductor substrates stacked and secured together to form a multi-chip structure. Preferably, the multi-chip structure has a plurality of openings that are formed between two adjacent substrates in a manner so as to permit a fluid to circulate in a region between the substrates, thereby providing cooling for the multi-chip structure.

In yet another aspect, the preferred embodiments of the present invention provide a method of forming an electronic packaging module. The method comprises forming a support frame on an upper surface of a first semiconductor substrate. Preferably, the support frame extends from the upper surface of the substrate and defines a protected spatial region for interconnection wiring. Preferably, the support frame also comprises a plurality of openings on a lateral surface of the support frame so as to permit a thermally conductive fluid to enter said spatial region and remove heat from the air bridge conductors and other interconnection wiring formed in the spatial region. In one embodiment, a temporary support material is also formed on the upper surface of the substrate in a manner such that the temporary support material stabilizes and provides structure support for the air bridge conductors so as to permit the chip to be processed and handled without causing damage to the air bridges and other interconnection. The method further comprises assembling the first semiconductor substrate in a chip stack in a manner such that an upper surface of the support frame is positioned adjacent to a lower surface of a second semiconductor substrate. Preferably, the temporary support material is removed from the substrate after the chip is completely assembled in the chip stack. The method further comprises enclosing the chip stack inside an enclosure and introducing a thermally conductive fluid to the enclosure. The thermally conductive fluid has a thermal conductivity greater than that of air and the conductive fluid travels through the opening in the support frame and contacts the air bridge conductors formed in the spatial region and removes heat therefrom. These and other advantages of the present invention will become more fully apparent from the following description taken in conjunction with the accompanying drawings.

DETAILED DESCRIPTION OF THE PREFERRED EMBODIMENT

Figure 1:
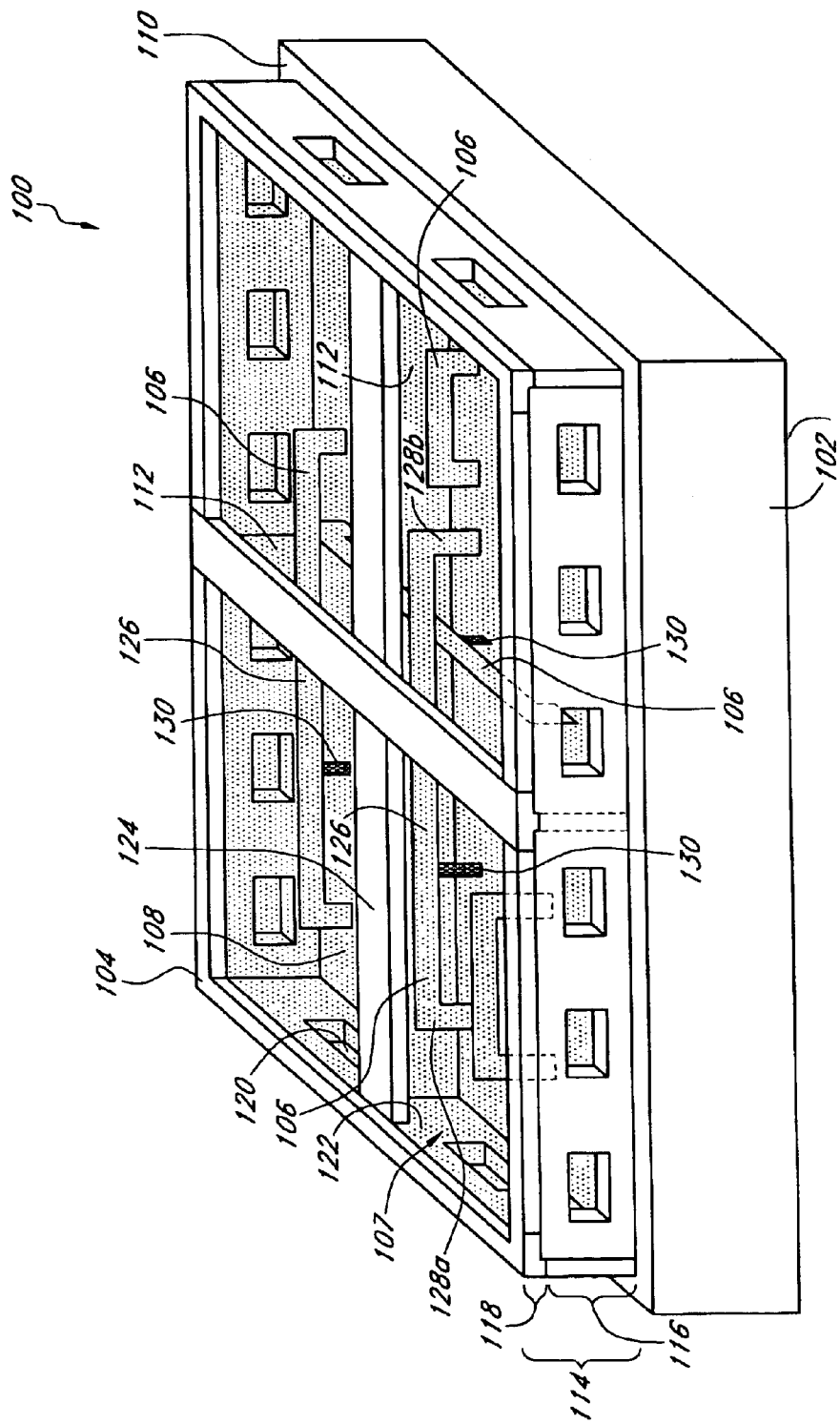
FIG. 1 is a partial schematic illustration of one embodiment of an integrated circuit chip that can be incorporated into a multi-chip electronic module of the preferred embodiment.

References will now be made to the drawings wherein like numerals refer to like parts throughout. FIG. 1 is a partial schematic illustration of one embodiment of an integrated circuit chip 100 that can be incorporated into a multi-chip electronic module of the preferred embodiment. As shown in FIG. 1, the chip 100 comprises a substrate 102, such as a silicon substrate, that carries a variety of integrated circuitry and devices, such as capacitors, resistors, transistors, memory cells, and logic gates, that are formed using conventional semiconductor manufacturing processes. As also shown in FIG. 1, the chip 100 further comprises a support frame 104, a plurality of air bridge structures 106, and a temporary support material 107 that are each formed on an upper surface 108 filling the remaining space of the substrate 102 using methods known in the art or, more preferably, in accordance with methods described in Applicant's co-pending U.S. patent Application Ser. No. 09/382, 929 entitled "PACKAGING OF ELECTRONIC CHIPS WITH AIR-BRIDGE STRUCTURES", which is incorporated by reference herein in its entirety.

As FIG. 1 illustrates, the support frame 104 is substantially rigid and extends from the upper surface 108 of the substrate 102 in a manner so as to protect the air bridge structures 106 and other interconnection wiring from being damaged by the weight of adjacent chips when the chip 100 is placed in a multi-chip stack and by handling during assembly of the stack. In one embodiment, the support frame 104 preferably extends along an outer perimeter 110 of the substrate 102 in a manner so as enclose the interconnection wiring formed on the upper surface 108 of the substrate 102. In another embodiment, the support frame 104 further includes a plurality of reinforcement ribs 112 that extend across the length and width of the substrate 102 to provide additional mechanical support and protection for the chip 100 and its interconnection wiring when the chip 100 is placed in a stack with other chips.

As FIG. 1 further illustrates, the support frame 104 defines a protected spatial region 114 extending above the upper surface 108 of the substrate 102. The spatial region 114 preferably comprises wiring levels 116 that are suitable for formation of air bridges 106 and other interconnection wiring. A wiring level is herein defined as a planar section above and substantially parallel to the upper surface of the substrate which contains air bridges and other conductors that extend in the same general plane. It can be appreciated that the chip 100 may comprise any number of wiring levels and is not limited to the number of wiring levels shown in FIG. 1.

Furthermore, the support frame 104 preferably has an upper portion 118 extending above the uppermost wiring level. The upper portion 118 preferably serves as a spacer separating the chip 100 from subsequently mounted adjacent chips. As will be described in greater detail below, the thickness of the upper portion 118 can be dimensioned in accordance with the particular spacing desired between adjacent chips. In one embodiment, the upper portion 118 is dimensioned so that the chip 100 when stacked in a multi-chip structure will be in proper alignment with conductive contacts, such as C4 contacts, positioned on chips that are subsequently mounted to the lateral faces of the multi-chip structure. Advantageously, the upper portion 118 of the support frame 104 may replace the conventional insulator spacer material that is typically interposed between adjacent chips in a chip stack. Because the upper portion 118 of the support frame 104 is substantially rigid and has a uniform thickness, it allows for more precise control and tuning of the distance separating adjacent chips in a chip stack.

Additionally, as shown in FIG. 1, the support frame 104 further comprises a plurality of openings 120 that are formed on a lateral surface 122 of the frame 104 using methods known in the art. As will be described in greater detail below, the openings 120 allow a thermally conductive medium, such as air, gas, or even liquid, to enter the spatial region 114 containing the air bridge structures 106 and circulate therethrough, thus removing heat generated from the conductors in the spatial region 114. Advantageously, the openings 120 permit a thermally conductive medium to circulate freely in and out of the spatial region 114 enclosed by the support frame 104 even when the chip 100 is placed in a stack with other chips. The openings 120 can be positioned at various locations on the support frame 104 and can take on a variety of different sizes and shapes without departing from the spirit of the invention.

In one embodiment, the support frame 104 is fabricated by depositing a layer of metal on the upper surface 108 of the substrate 102 using chemical vapor deposition (CVD), plasma enhanced CVD (PECVD), physical vapor deposition (PVD) techniques, elcectro-plating, electroless plating, sputtering, and/or electroforming. The metal layer is subsequently patterned and etched to define the configuration of the frame 104. In another embodiment, the support frame 104 and interconnection wiring for each wiring level are formed in the same process set using methods disclosed in Applicant's co-pending U.S. patent application, entitled "MICROELECTRONIC DEVICE PACKAGING WITH CONDUCTOR ELEMENT", which is incorporated by reference herein in its entirety. The support frame 104 can be made of a conductive material such as copper. Alternatively, the support frame 104 may comprise copper and an organic and/or inorganic insulating insert material. The insulating insert material is preferably incorporated in the reinforcement ribs 112 adjacent to where air bridge conductors are likely to extend through the ribs. In other embodiments, the support frame 104 may comprise an insulator made of organic and/or inorganic materials.

As FIG. 1 further shows, the temporary support material 107 formed on the upper surface 108 of the substrate 102 fills substantially the entire spatial region 114 comprising the interconnection wiring so as to stabilize and provide temporary structural support for the air bridges 106 and other circuitry therein. The temporary support material 107 permits the chip 100 to be processed and handled without causing damage to the air bridge conductors 106 or support frame 104 during subsequent process steps. The temporary support material 107 may be formed on the upper surface 108 of the substrate 102 using generally known chemical deposition processes. Preferably, the temporary support material 107 is polished back to a thickness that just exposes an upper surface 124 of the support frame 104 as shown in FIG. 1, which provides the chip with a leveled surface 124 for mounting as well as electrical bonding. The upper surface 124 of the support frame 104 and additional metal ledges (not shown) formed on the outside of the support frame 104 can be used to facilitate electrical detection of the end points during the process of removing the support material 107.

As described above, the temporary support material 107 stabilizes the air bridge structures 106 and the support frame 104 formed on the substrate 102, thus allowing the chip 100 to be handled and processed without being damaged. As such, the support material 107 preferably is not removed until the chip 100 has been assembled into a multi-chip stack. In one embodiment, the temporary support material 107 may comprise carbon or other materials that can be oxidized or otherwise chemically removed with relative ease. In another embodiment, the temporary support material 107 may comprise a polymer such as high temperature polyimide, a photoresist, parylene such as parylene C or any combinations thereof.

Furthermore, as shown in FIG. 1, the air bridge structures 106 are formed above the upper surface 108 of the substrate 102 to electrically interconnect a first and a second exposed contact 128a, 128b extending from the upper surface of the substrate 102. Each air bridge structure 106 generally comprises a conductor 126 that is suspended by the two or more conductive contacts 128a, 128b. As described above, the conductors 126 are stabilized and supported by the temporary support material 107, but will become suspended in air once the temporary support material 107 is removed. The air bridges 106 can be formed using methods known in the art such as damascene or dual damascene processes. Furthermore, Applicant also discloses a method of forming air bridge interconnects in U.S. Pat. No. 5,891,797 to Farrar entitled "METHOD OF FORMING A SUPPORT STRUCTURE FOR AIR BRIDGE WIRING OF AN INTEGRATED CIRCUIT," which is hereby incorporated by reference in its entirety. In one embodiment, the air bridge structures 126 may be fabricated using conductive materials, such as aluminum, copper, gold, silver, platinum, polysilicon, and amorphous silicon. In addition, methods for depositing conductive air bridge interconnects may include deposition processes, such as chemical vapor deposition (CVD), and physical vapor deposition (PVD), sputtering and electron beam evaporation or various liquid deposition techniques.

As FIG. 1 also shows, the air bridge conductors 126 may be further supported by a plurality of intermediate posts 130 that are formed on the upper surface 108 of the substrate 102. Once the temporary support material 107 is removed from underneath the conductors 126, the posts 130 are preferably used to support the longer air bridge conductors as the longer conductors may sag in the center and touch a neighboring air bridge interconnect, which may cause an electrical short therebetween. To reduce the occurrence of sagging, some longer air bridge interconnects may require more than one intermediate posts along the length of the bridge. The posts 130 may be formed using methods generally known in the art or those described in U.S. Pat. No. 5,891,797 to Farrar, or, more preferably, methods described in Applicant's co-pending Application Ser. No. 09/382,929 entitled "PACKAGING OF ELECTRONIC CHIPS WITH AIR-BRIDGE STRUCTURES". In one embodiment, the posts 130 are comprised of an insulating material such as $SiO_2$ or a polymer such as polyimide. In another embodiment, the posts 130 are comprised of the same material as the air bridge conductors 124, however insulator inserts are interposed between the posts and the substrate.

Figure 2:
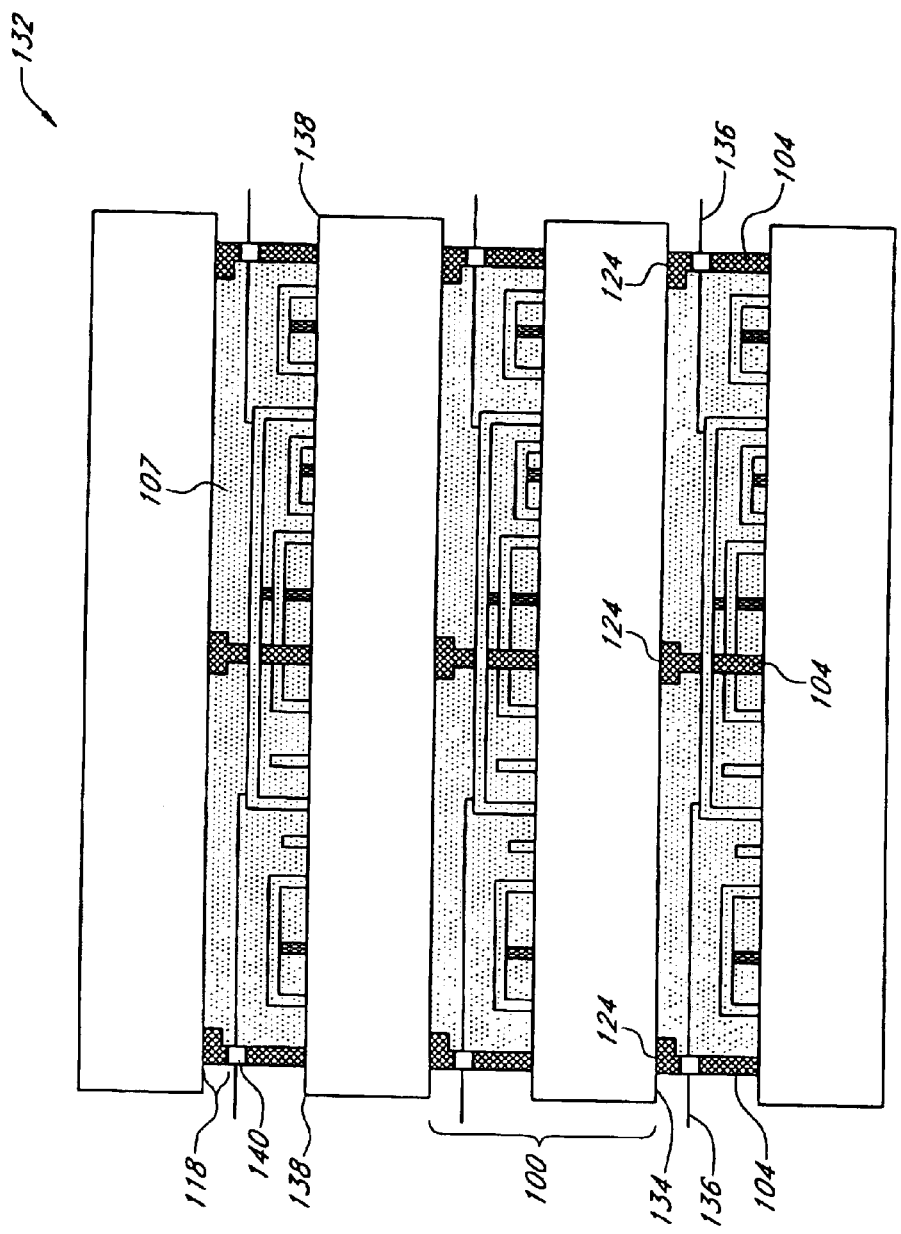
FIG. 2 is a partial schematic cross-sectional view of a chip stack incorporating the chip shown in FIG. 1.

FIG. 2 provides a partial schematic cross-sectional view of a chip stack 132 incorporating the chip 100 described and shown in FIG. 1. The chip stack 132 comprises a plurality of chips 100 that are stacked together in a manner such that the upper surface 124 of the support frame 104 of one chip is positioned adjacent to a lower surface 134 of the substrate 102 of another chip. The chips 100 may be bonded to each other using C4 contacts and/or adhesives as described in the Applicant's co-pending U.S. patent application Ser. No. 09/932,859 entitled "A THREE DIMENSIONAL MULTI-CHIP STRUCTURE AND METHOD OF MAKING THE SAME", which is incorporated by reference herein its entirety.

Furthermore, as described above, the thickness of the upper portion 118 of the support frame 104 can be fine tuned in accordance with the distance desired between chips 100. In one embodiment, the temporary support material 107 is removed once the chip stack 132 is assembled. However, in embodiments that involve mounting additional exterior chips to the lateral faces of the chip stack, the temporary support material 107 is preferably removed after the exterior chips are mounted. The temporary support material 107 is preferably chemically removed in a manner that does not damage the devices and circuitry formed on the chips. In one embodiment, the temporary material 107 is oxidized in an environment containing molecular oxygen or ozone or an oxygen plasma. In an oxidation process utilizing molecular oxygen, the process time, temperature and pressure can be increased to effectively remove substantially all carbon-based materials. In a plasma oxidation process, the lower pressures utilized are likely to facilitate complete removal of all organics. As such, it is desirable to use readily oxidized polymeric materials or carbon as the temporary support and/or spacer materials.

As FIG. 2 further shows, a plurality of conductive leads 136 extend from interconnects on the uppermost wiring level, through the support frame 104, and toward an outer edge 138 of the chip 100. Preferably, the leads 136 extend past the chip edge 138 and serve as electrical contact points with external circuitry. In cases where the support frame 104 is made of a conductive material, the leads 136 are preferably routed through an insulator insert 140 formed on the support frame 104 as shown in FIG. 2.

Figure 3:
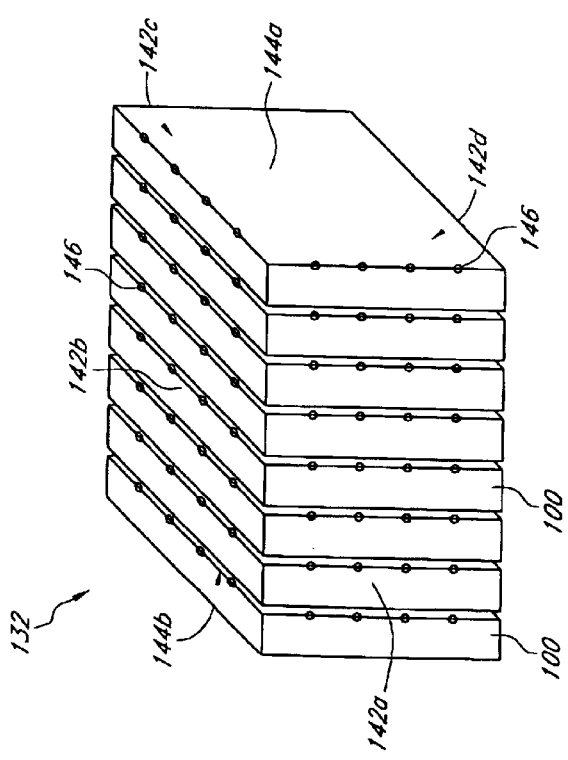
FIG. 3 is a schematic perspective view of the chip stack of FIG. 2.

FIG. 3 provides a schematic perspective view of the chip stack 132. As shown in FIG. 3, the chip stack 132 comprises a plurality of lateral faces 142a–142d and an upper and a lower face 144a, 144b. Preferably, each lateral face of the stack 132 is comprised of a side surface of each chip 100 and the upper and lower faces of the stack 132 comprise the respective outer substrate surfaces of the chips located on the ends of the stack. FIG. 3 also shows a plurality of electrical contacts 146 that are formed on the lateral faces 142a–142d of the chip stack 132. These electrical contacts 146 are preferably interconnected to the conductive leads that extend from the upper wiring level of each chip 100. In one embodiment, the chips 100 in the stack 132 are memory chips. In another embodiment, only a portion of the chips in the chip stack 132 incorporate the air bridge structures and the support frames as described above while the remaining chips utilize conventional circuitry and spacer material between chips so as to improve the overall structural integrity and ruggedness of the chip stack.

Figure 4:
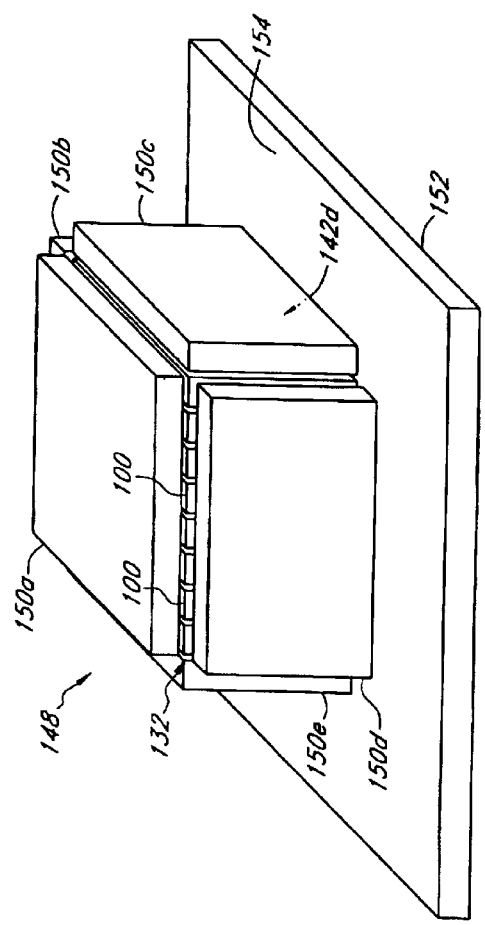
FIG. 4 is a multi-chip structure incorporating the chip stack of FIG. 3.

With reference to FIG. 4, a plurality of exterior chips 150a–e are mounted to the lateral, upper and lower faces of the chip stack 132 to form a multi-chip module 148. The exterior chips may comprise integrated circuit chips of an entire system including processor chips, memory chips, logic chips, and A/D converter chips that may not be included in most conventional integrated circuit chips due to overheating and chip interconnection problems. The exterior chips can be mounted and interconnected to the chip stack using C4 connections, modified C4 connections and other methods disclosed in Applicant's co-pending U.S. patent applications, entitled "A THREE DIMENSIONAL MULTI-CHIP STRUCTURE AND METHOD OF MAKING THE SAME", Ser. No. 09/932,859 and "ANGLED INTERCONNECT", Ser. No. 09/944,957, which are hereby incorporated by reference in its entirety. As described above, in one embodiment, the distance between rows of conductive interconnects on adjacent chips are precisely fixed by the upper portions of the support frame on each chip so that the interconnects may be aligned with the C4 structures formed on the exterior chips. FIG. 4 further shows that the multi-chip structure 148 is electrically interconnected to external circuitry formed on a bonding substrate 152. In one embodiment, the fourth lateral face 142d of the chip stack 132 is preferably bonded to an upper surface 154 of the substrate 152 in a manner such that electrical contacts (not shown) on the fourth lateral face 142d is interconnected with circuitry formed on the upper surface 154 of the bonding substrate 152. Generally known techniques such as C4 connections and flip-chip bonding may be used to establish electrical interconnection. In another embodiment, a heat sink may be attached to the stack 132 prior to bonding to the substrate 152.

Figure 5:
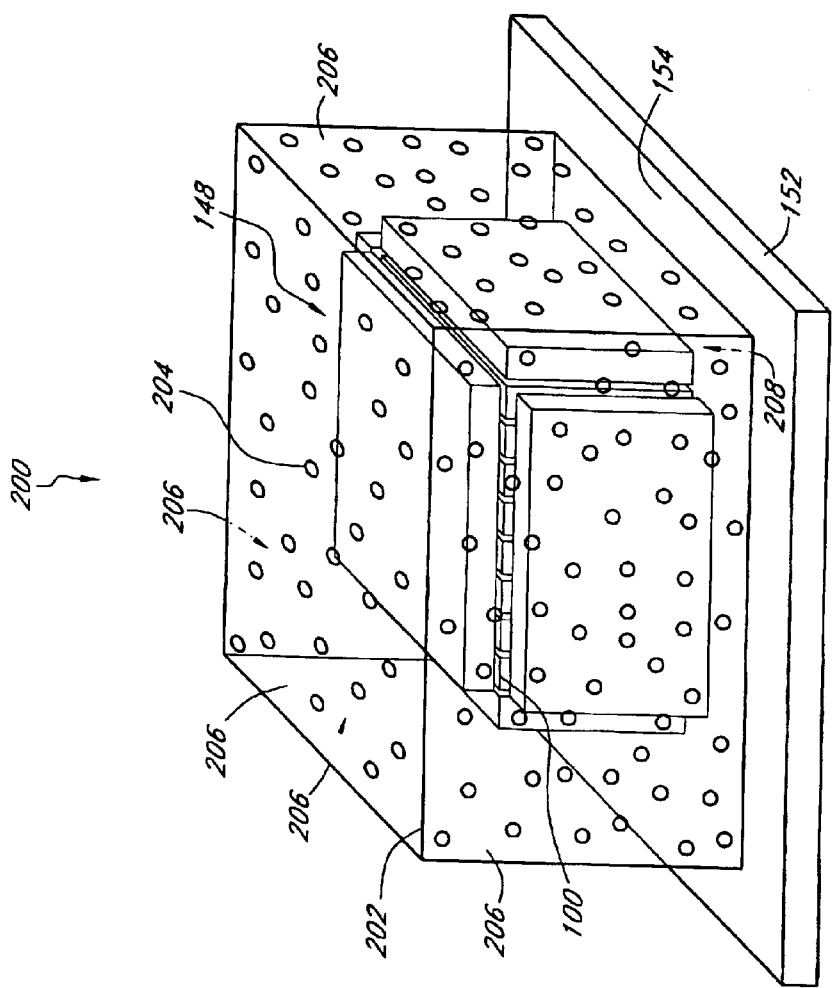
FIG. 5 is a schematic illustration of a high-density electronic packaging module of the preferred embodiment incorporating the multi-chip structure of FIG. 4.

FIG. 5 provides a schematic illustration of a high-density electronic packaging module 200 of the preferred embodiment in which the multi-chip structure 148 is enclosed in an enclosure 202 filled with a thermally conductive medium 204. As shown in FIG. 5, the enclosure 202 comprises a plurality of walls 206 defining an interior space 208 that is sufficiently large to contain the multi-chip structure 148 and still retain sufficient free space to permit the thermally conductive medium 204 to circulate around the multi-chip structure 148. Preferably, the thermally conductive medium 204 acts as a heat sink by contacting the air bridges and other circuitry and devices in the multi-chip structure and transferring heat generated therefrom to the thermally conductive medium. Although the chips 100 are stacked together, the thermally conductive medium 204 is able to circulate to and from the air bridge structures and other conductors within the stack by traveling through the openings formed on the lateral surfaces of the support frames in each chip.

In one embodiment, the enclosure 202 is placed over the multi-chip structure 148 and attached to the tipper surface 154 of the bonding substrate 152. Preferably, the enclosure is hermetically sealed to the bonding substrate so as to isolate the structure 148 from the external environment and to retain the thermally conductive medium 204 inside the enclosure. The enclosure 202 may be formed of an insulator material or a conductive material, such as glass or metal, in a manner known in the art. Preferably, the enclosure 202 is comprised of a copper alloy having a high thermal conductivity and sufficiently rigid to support a pressurized fluid. Moreover, the enclosure 202 is preferably comprised of a material that inhibits diffusivity of the thermally conductive medium 204.

In one embodiment, the thermally conductive medium 204 comprises a thermally conductive gas having a thermal conductivity greater than that of air. Preferably, the gas comprises pure hydrogen, helium, or a hydrogen-helium gaseous mixture. There are a number of advantages in selecting a hydrogen-helium gaseous mixture as the thermally conductive medium 204. First, the thermal conductivities of hydrogen and helium are similar to each other and much higher than those of most other gases. Second, the permeability or diffusivity of molecular hydrogen through some metals, glasses, and other enclosures is significantly smaller than that of helium, and hence is less prone to diffuse out of an enclosure over time. However, the use of pure hydrogen gas may raise some safety concerns under certain operating conditions. Thus, a hydrogen/helium gas mixture provides a gas mixture that has high thermal conductivity, relatively low diffusivity, and yet does not raise any substantial safety concerns. In one embodiment, the gas mixture comprises about 10% hydrogen and 90% helium. Other embodiments may comprise various other ratios of hydrogen to helium.

Furthermore, the thermally conductive medium 204 may be pressurized so as to increase the density of the gas mixture that is enclosed by the enclosure 202. In one embodiment, the pressure of the thermally conductive fluid is maintained between a range of 5 MPa and 50 MPa. Advantageously, the thermal conductivities of hydrogen and helium are approximately proportional to their pressures and the thermal conductivity of a pressurized mixture of hydrogen and helium is remarkably high. For example, a hydrogen/helium gas mixtures at pressures of about 5 to 50 MPa yield thermal conductivities of about $1.6 \times 10^{-3}$ to $1.6 \times 10^{-2}$ cal-cm/sec, respectively. When compared with a thermal conductivity value of about $2.3 \times 10^{-2}$ for fused silicon and about $5.7 \times 10^{-5}$ for air at atmospheric pressure, a hydrogen/helium mixture at 50 MPa pressure is almost 300 hundred times that of air at atmospheric pressure. However, it can be appreciated that the optimum gas compositions and pressures will vary with the particular application being used. For example, in relatively larger volume packages, less helium-rich mixtures may suffice since loss of helium via out-diffusion through the enclosure may be insignificant. In small electronic packages, the use of pure hydrogen may be preferred since the thermal conductivity may be higher, out-diffusion may be negligible, and safety concerns may be relatively insignificant. It can also be appreciated that the thermally conductive medium 204 is not limited to any gaseous mixture and may comprise any type of thermally conductive fluid, including liquids.

Although the multi-chip structure 148 of the preferred embodiment comprises air bridge structures that utilize air gap as an insulator, the electronic packaging module 200 is not limited to multi-chip structures that incorporate air insulators. In fact, the packaging module 200 may incorporate multi-chip structures that utilize various approaches for insulating the metallurgical interconnection layers including low thermal conductivity spacer layers, such as low density polymeric foams, and/or insulator structures, such as silicon dioxide films and/or various hybrid insulating approaches. Implementation of the disclosed embodiments may be compatible with flip-chip bonding of the entire assembly to a ceramic substrate or other substrate. Furthermore, the enclosure 202 may be cooled using generally known cooling techniques, such as heat pipes, liquid coolants, external fins, and/or convective cooling fans.

Advantageously, the unique spacing configuration of the multi-chip structure 148 permits efficient cooling by utilizing a pressurized, thermally conductive medium as a heat sink. The hermetically sealed enclosure permits efficient, pressurized cooling of the multi-chip structures, which may increase the reliability of the chip structures by reducing the occurrence of thermal breakdown associated with the self-overheating of integrated circuit components. Furthermore, increasing system reliability may reduce the incidence of system malfunctions.

As discussed above, densely packed integrated circuit chips such as those in a multi-chip structure tend to produce an increased amount of heat during normal operation. Therefore, an efficient system of cooling the chip by transferring a substantially amount of heat away from the chip improves the performance and reliability of the chip by reducing self-overheating. Advantageously, the electronic packaging module of the preferred embodiment provides a chip stack having open spaces created between adjacent chip substrates to allow a thermally conductive gas mixture to readily permeate the spaces and reach the air bridge conductors and other circuitry therein, which substantially reduces thermal hot spots within the multi-chip electronic package.

Although the foregoing description of the various embodiments of the invention have shown, described, and pointed out the fundamental novel features of the present invention, it will be understood that various omissions, substitutions, and changes in the form of the detail of the apparatus as illustrated as well as the uses thereof, may be made by those skilled in the art, without departing from the scope of the present invention. Consequently, the scope of the present invention should not be limited to the foregoing discussions, but should be defined by the appended claims.

What is claimed is:

1. An electronic packaging module, comprising:
    a plurality of integrated circuit chips stacked and secured together to form a chip stack wherein the chip stack has a first lateral face that is comprised of a first portion of each chip;
    an enclosure enclosing the chip stack, wherein the enclosure is configured to receive and enclose a thermally conductive fluid having a thermal conductivity greater than that of air at one atmosphere, wherein said thermally conductive fluid contacts the chip stack and transfers heat therefrom.

2. The module of claim 1, wherein said thermally conductive fluid comprises a gas.

3. The module of claim 1, wherein said thermally conductive fluid comprises a liquid.

4. The module of claim 2, wherein said thermally conductive gas comprises a mixture of hydrogen and helium.

5. The module of claim 4, said thermally conductive gas comprises about 10% hydrogen and about 90% helium.

6. The module of claim 2, wherein said thermally conductive gas comprises pure hydrogen.

7. The module of claim 2, wherein said thermally conductive fluid has a pressure that is higher than a pressure external to the enclosure.

8. The module of claim 7, wherein said gas is at a pressure between about 5 MPa and 50 MPa.

9. The module of claim 7, wherein said gas has thermal conductivity between about $1.6 \times 10^{-3}$ cal-cm/sec-C and $1.6 \times 10^{-2}$ cal-cm/sec-C.

10. The module of claim 1, wherein said enclosure is hermetically sealed so as to substantially retain the thermally conductive fluid inside the enclosure.

11. The module of claim 10 further comprising a bonding substrate, wherein the first lateral face of the chip stack is bonded to an upper surface of the bonding substrate, wherein the enclosure is hermetically sealed to the upper surface of the bonding substrate.

12. The module of claim 11, wherein said chip stack is bonded to the bonding substrate using C4 connections.

13. The module of claim 1, wherein said enclosure is made of a thermally conductive material.

14. The module of claim 13, wherein said enclosure is made of a copper alloy.

15. The module of claim 1, wherein at least one chip comprises a substrate and a support frame extending from an upper surface of the substrate and along an outer perimeter of the substrate so as to define a spatial region containing interconnection wiring, said support frame comprises a plurality of openings that are configured to permit the thermally conductive fluid to flow therethrough and contact the interconnection wiring in the spatial region.

16. The module of claim 15, wherein the interconnection wiring comprises air bridge conductors.

17. The module of claim 16, wherein at least one air bridge conductor is supported by an intermediate post formed on the upper surface of the substrate.

18. The module of claim 15, wherein the support frame further comprises an upper portion, wherein said upper portion provides a spacer separating the chip from an adjacent chip in the stack.

19. The module of claim 18, wherein the upper portion of the support frame is dimensioned to achieve a pre-selected distance between the two adjacent chips.

20. The module of claim 17, wherein said post comprises substantially the same material as that of the air bridge conductor.

21. The module of claim 17, wherein said post comprises an insulating material.

22. The module of claim 21, wherein said insulating material comprises $SiO_2$.

23. The module of claim 21, wherein said post comprises a polymer.

24. The module of claim 23, wherein said polymer comprises a polyimide.

25. The module of claim 15, wherein the support frame further comprises at least one reinforcement ribs that extends across the upper surface of the substrate, wherein said reinforcement rib provides structural support for the chip.

26. The module of claim 25, wherein said reinforcement rib comprises a metal with an insulating insert material.

27. The module of claim 26, wherein said insulating insert material is selected from the group consisting of inorganic and organic materials.

28. The module of claim 19, wherein said chip stack has a second lateral face, wherein the second lateral face comprises a second portion of each chip, wherein an exterior chip is bonded to said second lateral face in a manner such that a first surface of the exterior chip extends across at least a portion of the second lateral face, wherein said exterior chip is bonded to the second lateral face using C4 connections, wherein the C4 connections are aligned with a first and a second row of conductive contacts formed respectively on the adjacent chips that are spaced apart at a pre-selected distance.

29. The module of claim 1, wherein an insulating material is disposed between adjacent chips in the stack.

30. An electronic packaging module, comprising:
a plurality of integrated circuit chips stacked and secured together to form a chip stack wherein the chip stack has four lateral faces, wherein each lateral face comprises a portion of each chip;
three exterior chips mounted respectively to three of the lateral faces of the chip stack, wherein a surface of each exterior chip extends across at least a portion of each respective lateral face;
a bonding substrate wherein the substrate is electrically connected to the fourth lateral face of the chip stack;
an enclosure enclosing said chip stack, said exterior chips, and at least a portion of said bonding substrate, wherein said enclosure also contains a thermally conductive fluid having a thermal conductivity greater than that of air, wherein said fluid makes contact with at least some of the chips and transfers heat away from said chips.

31. The module of claim 30, wherein said chip stack comprises memory chips.

32. The module of claim 31, wherein said exterior chips comprise non-memory chips.

33. The module of claim 32, wherein said exterior chips comprise logic chips.

34. The module of claim 33, wherein said exterior chips are electrically connected to the chips in said chip stack by using C4 connections.

35. The module of claim 33, wherein said exterior chips are interconnected to each other by using edge connections.

36. The module of claim 33, wherein said exterior chips are interconnected to each other by using a modified C4 connection.

37. The module of claim 30, wherein said bonding substrate is electrically interconnected to the fourth lateral face of the chip stack by using C4 connections.

38. The module of claim 30, wherein said enclosure is hermetically sealed.

39. The module of claim 30, wherein at least one chip in the stack comprises an air bridge structure.

40. The module of claim 30, wherein at least one opening is formed adjacent the air bridge support so as to permit the thermally conductive fluid in the enclosure to contact the air bridge structure and transfer heat away from the structure.

41. The module of claim 30, wherein the thermally conductive fluid has a pressure that is higher than pressure external to the enclosure.

42. The module of claim 41, wherein said gas mixture has a pressure between about 5 mPA and 50 mPA.

43. The module of claim 42, wherein said gas mixture comprises helium and hydrogen.

44. A method of forming an electronic packaging module, comprising:
forming a support frame on an upper surface of a first semiconductor substrate, wherein said support frame extends from the upper surface of the substrate and defines a protected spatial region for interconnection wiring, wherein said support frame comprises a plurality of openings on a lateral surface of the frame so as to permit a thermally conductive fluid to travel to and from said spatial region;
forming a plurality of interconnection wiring in said spatial region, wherein the interconnection wiring comprises air bridge conductors;

forming a temporary support material in the spatial region in a manner such that the temporary support material stabilizes and provides structure support for the air bridge conductors;

assembling said first semiconductor substrate in a chip stack, wherein an upper surface of the support frame is positioned adjacent to a lower surface of a second semiconductor substrate;

bonding said chip stack to a bonding substrate, wherein said chip stack is electrically connected to external circuitry formed on said bonding substrate;

removing said temporary support material from the spatial region in a manner such that the air bridge conductors become suspended and surrounded by an air gap;

enclosing said chip stack inside an enclosure;

introducing a thermally conductive fluid to said enclosure, said thermally conductive fluid has a thermal conductivity greater than that of air, wherein said thermally conductive fluid travels through the opening in the support frame and contacts the air bridge conductors formed in the spatial region.

45. The method of claim 44, wherein forming said temporary support material comprises forming a layer of organic material that can be chemically removed.

46. The method of claim 45, wherein forming said temporary support material comprises forming a layer of material comprising carbon.

47. The method of claim 45, where forming said temporary support material comprises forming a layer of material comprising parylene.

48. The method of claim 47, wherein the parylene is parylene C.

49. The method of claim 45, wherein forming said temporary support material comprises forming a layer of polymer.

50. The method of claim 49, wherein said polymer is a high temperature polyimide.

51. The method of claim 49, wherein said polymer is a photoresist.

52. The method of claim 44, wherein removing said temporary support material comprises oxidizing said support material.

53. The method of claim 52, wherein oxidizing said support material comprises oxidizing the material in a molecular oxygen environment.

54. The method of claim 52, wherein oxidizing said support material comprises oxidizing the material in a plasma environment.

55. The method of claim 44 further comprising attaching a heat sink to said chip stack prior to removing said temporary support material.

56. The method of claim 44, wherein introducing said thermally conductive fluid into said enclosure comprises introducing a gas mixture comprising helium and hydrogen.

57. The method of claim 56, wherein said gas mixture is at a pressure higher than pressure external to the enclosure.

58. An electronic packaging module, comprising:

a plurality of semiconductor substrates stacked and secured together to form a multi-chip structure, wherein the multi-chip structure comprises a plurality of openings that are formed between two adjacent substrates in a manner so as to permit a fluid to circulate in a region between the substrates, thereby providing cooling for the multi-chip structure.

59. The module of claim 58, further comprising an enclosure wherein said enclosure encloses the multi-chip structure and is configured to receive and enclose a thermally conductive fluid having a thermal conductivity greater than that of air at one atmosphere, wherein said thermally conductive fluid contacts the multi-chip structure and transfers heat therefrom.

60. The module of claim 58, where said region between the substrates comprises a plurality of air bridge structures.

61. The module of claim 58, wherein the multi-chip structure has a first lateral face that is comprised a side surface of each substrate.

62. The module of claim 61, wherein said openings are formed on the first lateral face.

* * * * *

UNITED STATES PATENT AND TRADEMARK OFFICE
CERTIFICATE OF CORRECTION

PATENT NO. : 6,747,347 B2
DATED : June 8, 2004
INVENTOR(S) : Farrar et al.

Page 1 of 1

It is certified that error appears in the above-identified patent and that said Letters Patent is hereby corrected as shown below:

<u>Column 8,</u>
Line 62, please delete "tipper" and insert therefore, -- upper --.

Signed and Sealed this

Eighth Day of November, 2005

JON W. DUDAS
*Director of the United States Patent and Trademark Office*